Figure 1:
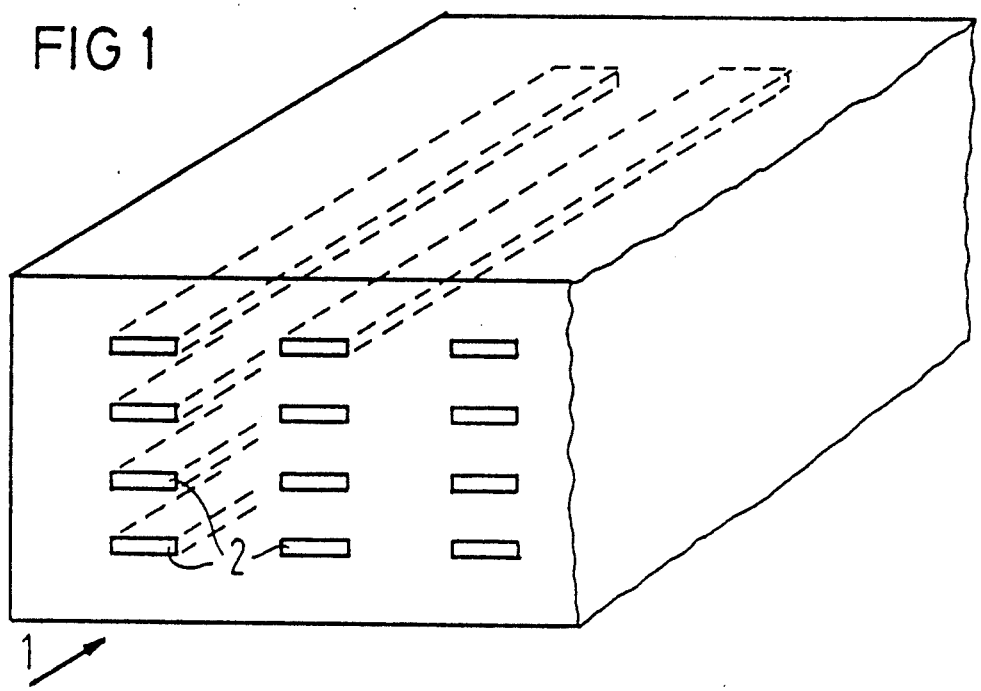

United States Patent
Bast

[11] Patent Number: 5,045,437
[45] Date of Patent: * Sep. 3, 1991

[54] METHOD FOR PRODUCING A STRUCTURED CERAMIC FILM OR A CERAMIC MEMBER CONSTRUCTED OF SUCH FILMS BY SINTERING AND USEFUL AS ULTRASOUND TRANSDUCERS

[75] Inventor: Ulrich Bast, Munich, Fed. Rep. of Germany

[73] Assignee: Siemens Aktiengesellschaft, Munich, Fed. Rep. of Germany

[*] Notice: The portion of the term of this patent subsequent to Oct. 24, 2006 has been disclaimed.

[21] Appl. No.: 432,724
[22] PCT Filed: Apr. 27, 1988
[86] PCT No.: PCT/DE88/00250
§ 371 Date: Oct. 27, 1989
§ 102(e) Date: Oct. 27, 1989
[87] PCT Pub. No.: WO88/08360
PCT Pub. Date: Nov. 3, 1988

[30] Foreign Application Priority Data
Apr. 27, 1987 [DE] Fed. Rep. of Germany ....... 3713987

[51] Int. Cl.$^5$ ................................................ G03C 5/40
[52] U.S. Cl. .................................... 430/320; 430/330; 430/198
[58] Field of Search ......................... 430/320, 330, 198

[56] References Cited

U.S. PATENT DOCUMENTS

| | | | |
|---|---|---|---|
| 3,703,864 | 11/1972 | Bradford | 430/320 |
| 4,528,260 | 6/1985 | Kane | 430/321 |
| 4,876,179 | 10/1989 | Bast et al. | 430/320 |

FOREIGN PATENT DOCUMENTS

| | | |
|---|---|---|
| 1145123 | 6/1985 | European Pat. Off. . |
| 4439702 | 1/1969 | Fed. Rep. of Germany . |
| 2142535 | 3/1972 | Fed. Rep. of Germany . |
| 919911 | 3/1947 | France . |
| 2455499 | 11/1980 | France . |

Primary Examiner—Marion E. McCamish
Assistant Examiner—Mark Chapman
Attorney, Agent, or Firm—Hill, Van Santen, Steadman & Simpson

[57] ABSTRACT

Method for producing structured ceramic films (111) as well as ceramic members (1) manufactured therefrom and having interior cavities (2) upon employment of photolithographic structuring and liquid jet erosion (21).

5 Claims, 2 Drawing Sheets

FIG 1

METHOD FOR PRODUCING A STRUCTURED CERAMIC FILM OR A CERAMIC MEMBER CONSTRUCTED OF SUCH FILMS BY SINTERING AND USEFUL AS ULTRASOUND TRANSDUCERS

The present invention is directed to a method for producing a structured ceramic film. Further, the invention is directed to the manufacture of a ceramic member composed of such ceramic films. The structuring of such a ceramic film is comprised in depressions or, respectively, recesses that can also be holes that proceed through the film. The production of the depressions, recesses or holes thereby ensues by processing the film in the condition of a green film. What is to be understood by a green film is the intermediate stage occurring in the manufacturing method of a ceramic film wherein the suspension material to be subsequently sintered to form a ceramic and having the bonding agent or, respectively, binding system contained therein is brought into the shape of the as yet unsintered film.

A known method of this species is to provide the green film composed of the suspension material and the binder system and acquired by drawing the suspension into a film with holes by punching and, finally, to sinter this structured green film. A thin ceramic film provided with these holes that corresponds to the thickness of the green film is thereby obtained, this ceramic film being capable of being employed, for example, as a substrate plate. Such substrate plates, particularly those of aluminum oxide, are especially employed in electronic circuit technology for formatting hybrid circuits.

It is already known to produce ceramic members provided with inwardly disposed or, respectively, inner cavities.

German published application 14 39 702 discloses a manufacturing method wherein cavities are already present in the ceramic member before the sintering of the ceramic member provided for a capacitor.

Development has progressed to the point of manufacturing the members of such multi-layer capacitors in such fashion that a structure composed of a mixture of lampblack and zirconium dioxide grains that corresponds to the structure of the prescribed cavities is applied on green films. Such green films provided with structures are stacked on top of one another, are pressed together and sintered, whereby the applied structure is pressed into the film. The lampblack burns during the sintering and the zirconium oxide grains remain in the arising cavities. The cavities that have arisen between the zirconium oxide grains are filled with molten metal, particularly lead, so that inner electrodes are formed.

Members that are composed of piezoelectric ceramic and are monolithic in their sintered condition but do not yet have filled inner cavities are employed as ultrasound transducers, particularly for medical diagnosis. The cavities that are so numerous and so small in the piezo ceramic material that they act like pores reduce the acoustic impedance of this material and thus improve the acoustic matching of the material of the ultrasound transducer to the body tissue. It has likewise already been proposed to fashion elongated cavities in the interior of the ceramic member of an ultrasound transducer. These cavities are fashioned and arranged such that they prevent or at least reduce the formation of disturbing modes of transverse vibrations.

The ceramic members coming into consideration here were manufactured in such fashion that individual green films were first provided with a structured photoresist layer or, respectively, with structures composed of photoresist in a photolithographic way and these films were then pressed to form a stack and were sintered. The stack that is sintered together forms a monolithic ceramic member in whose interior cavities that correspond to the photolithographic structures on the original green films are situated. The photoresist burns off during the sintering process and leaves corresponding cavities in the foil stack. Such cavities can be arranged exactly placed in a ceramic member (and, for example, can serve as electrodes when filled with metal). Cavities that are usually smaller and are arranged distributed in such a ceramic member sintered together of green films lead thereto that a designationally dimensioned porosity is present in the ceramic member. However, it has been found that the photoresist applied on the green films shrinks given the high temperatures occurring during sintering and produces damage to the surface of the respective ceramic film. During sintering, moreover, the burn-off of the photoresist produces the risk that the compressed stack of individual films (from which it was originally composed) will correspondingly delaminate, i.e. decompose into individual layers. This method that was employed earlier also does not make it possible to produce ceramic members in which cavities that extend over a plurality of levels are situated.

An object of the present invention is to specify a method that is especially simple in technological terms with whose assistance such ceramic films (as yet unsintered) structured with depressions, recesses or holes can be manufactured. A development of the object is comprised in exploiting this method such that ceramic members provided with defined cavities an be manufactured with a method for producing a ceramic film having depressions, holes, recesses and the like, whereby the structuring of the film ensues in the condition thereof as green film having a binder system contained therein, ensuing with the assistance of photolithography which is characterized by a surface of the green film being provided with a photoresist layer and which structures having a prescribed planer distribution and size of the depressions, holes, recesses and the like to be produced are produced in a photolithographic way for employment as a mask, in that the depressions, holes, recesses and the like are produced down to a respectively prescribed depth in the green film by erosion with a liquid jet, whereby the structured photoresist layer is effective as a mask. layer for the respective erosion; and in that an agent that has a selective solubility for the binder system contained in the material of the green film is used for the liquid jet. Developments of this method include providing a binder system based on acrylic acid ester, wherein the agent used in the liquid jet is essentially of benzene hydrocarbon and the material used for the photoresist layer is resistant to the benzene hydrocarbon for at least the time span of the processing. The present invention also provides a method for producing sintered members having inwardly disposed cavities in which a plurality of green films are produced with depressions, holes, recesses or the like according to the foregoing described method steps are then stacked on top of one another, pressed and subsequently sintered. As a further variation, green films which are produced according to the foregoing may also be stacked with non-structured green films, pressed and subsequently sintered. The monolithic member of piezo ceramic manufactured according to the foregoing steps may be used for ultrasound transducers. For purposes of the present invention, the term "ceramic film" is understood to include "ceramic tape". The production of ceramic tape is by a process known as tape casting.

The method of the invention is executed in such fashion that a photoresist layer or dry resist layer/film (referred to as photoresist below) composed, for example, of the material Kalle, Ozatec R225 is applied onto the one surface of a green film (still unsintered) produced according to standard method. Using known methods of photolithography, this photo-sensitive layer is structured into a mask layer that has holes, recesses or the like extending down to the surface of the green film at those locations at which the green film and the ceramic film manufactured later should exhibit holes or, respectively, cavities.

After the surface of the green film is thus provided with such a mask layer having holes and the like contained therein, this green film is charged with a thin liquid jet on that side provided with the photoresist, an erosion that leads to the production of the depressions that are then present later being carried out with this liquid jet.

Dependent on the fineness of the required depressions, holes and the like, work can be carried out with a correspondingly fine liquid jet. A typical diameter of such a jet amounts to 0.6 mm. The solvent provided for the jet, i.e. the solvent contained therein, is such a solvent that acts to the effect of bringing the binder system or, respectively, a constituent of the binder system to initial swelling such that the following, erosive removal of material of the green film is enabled. This erosive removal is carried out with high jet pressure. Work can also be carried out with a comparatively large-area jet or can be simultaneously carried out with a plurality of or, respectively, with many jets.

No erosion occurs at those locations that remain covered by photoresist, so that the depressions in the green film are in fact executed only at the locations not covered by photoresist. The jet employed herein and the green film are advantageously moved toward one another, so that the erosive removal of material of the green film is carried out at all locations having holes, recesses and the like in the photoresist. According to this method, the depressions can be taken so far that holes also arise in the green film, i.e. boring through the green film has been carried out.

In accord with one feature of the invention, the solvent is selected such that the binder of the ceramic foil but not the photoresist material itself is attacked. The afore-mentioned photoresist material Ozatec R225 and a binder system provided for the green film on the basis of acrylic acid ester is an advantageous combination with which toluol or a mixture of toluol and decahydronaphthaline can be very advantageously employed, for example in a ratio of 3:2.

A material given which higher chemical resistance can be additionally effected by re-exposure or by tempering at high temperature is particularly employed as photoresist. An additional metal film that allows higher resistance to be achieved can also be employed.

After the execution of the erosive treatment that has been set forth, the photoresist that is still present on the green film is dissolved. Given positive photoresist, for example, an exposure and developing of the photoresist that is now surface-wide is suitable. The photoresist material that is still present is thus rendered soluble and can be easily removed.

After the removal of the photoresist material has been carried out, green films provided with depressions or, respectively, holes in accord with the above method steps are stacked and are exposed to a pressing power at elevated temperature. During the following baking process, the foil stack composed of the original green films is sintered to form a monolithic ceramic block that, however, contains the previously produced depressions and holes of the individual green films as cavities.

Such a monolithic ceramic member comprising cavities produced according to the method and distributed in a prescribed fashion is subjected to further processing steps; for example, metallization for producing electrodes, the required polarizing with which the piezoelectric properties become effective are carried out.

In terms of the principle, materials processing with a liquid jet is known per se. For example, steel plates are cut with a water jet. In the method of the present invention, by contrast, a process that is two-stage in principle is carried out, namely, by selecting the composition of the liquid with reference to the material to be processed, namely the binder thereof, one effect is that a swelling and, thus, a corresponding reduction in the strength of the material of the green film occurs. The material treated in this fashion that has thus been lent a property different from the original material of the green film is then separated and rinsed away by the liquid jet treatment.

Compared to a known laser jet structuring (of, for example, printed circuit boards), these measures employed in the invention have rather decisive advantages.

The inventively employed processing method produces no heating in the processed material. Over and above this, by contrast, the liquid jet is even capable of cooling. Large surfaces can be structured in a short time; in particular, they can be eroded surface-wide. The afore-mentioned absence of heating makes any and all warping of the desired shapes impossible. The organic binder is not gaseously decomposed given employment of the invention but is washed out in liquid form. This prevents deposits otherwise appearing due to condensation of the decomposition products at cooler parts (of the apparatus) from being present. Loosened material is removed by the washing and can be easily separated. Dusts cannot occur, so that appropriate work rules can also be managed in a simple way.

Although the measures employed in the invention are suitable precisely for the erosion of great quantities, they are also advantageous for superfine structures. In particular, the depth of the structuring can be easily reliably set with these measures (for example, more easily than with laser emission).

Compared, for example, to laser beam materials processing, implementing these measures employed in the invention does not require any complicated apparatus and certainly does not require any apparatus requiring large spaces.

The afore-mentioned German Published Application 21 42 535, for example, recites that lead oxides and titanium oxides can be easily converted into metallic lead and titanium with the processing laser emission. Given the temperatures that occur, part of this lead is present in vapor form.

Examples of a monolithic ceramic member manufactured according to the method of the invention shall be set forth below with reference to figures.

FIG. 1 shows a monolithic, sintered ceramic member 1 manufactured according to the invention that comprises channel-like cavities referenced 2 that are designed and positioned in terms of execution and position as may be seen from FIG. 1.

Figure 2:
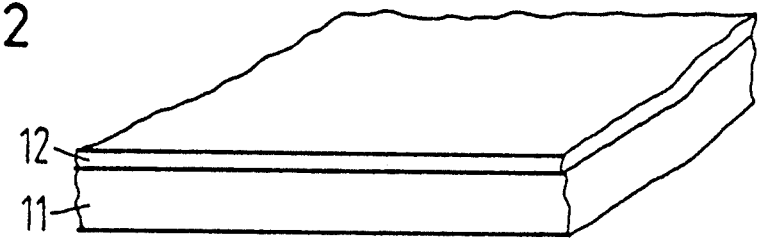

In one embodiment of the invention, such a monolithic ceramic member 1 is manufactured in such fashion that a multitude of green films are produced, as the example of FIG. 2 shows. The green films can be composed of compositions for sintered piezo ceramic, substrate ceramic and the like, for example of lead zirconate titanate, aluminum oxide, etc.

The green film 11 in FIG. 2 has already been coated surface-wide with a layer 12 of photoresist material.

Figure 3:
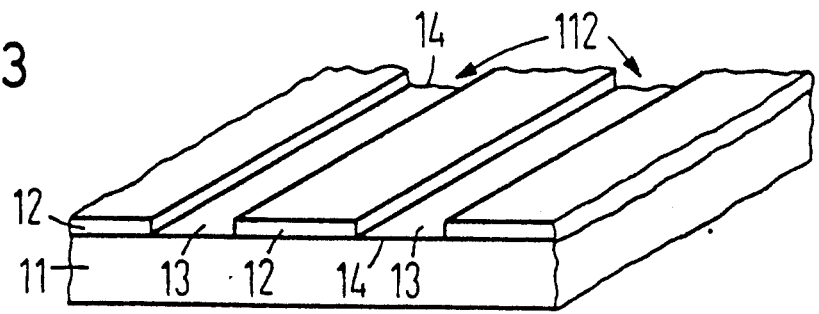

This photoresist layer 12 is provided with the structure 112 shown in FIG. 3 in a standard photolithographic way. In individual strips 13, the material of the photoresist layer 12 has been eliminated to such an extent that the original surface 14 of the green film 11 is exposed. The structures 112 have dimensions down to, for example, 50 μm in accord with the essentially identically sized dimensions of the depressions, cavities, holes and the like to be produced in the green film or, respectively, in the finished member.

Figure 4:
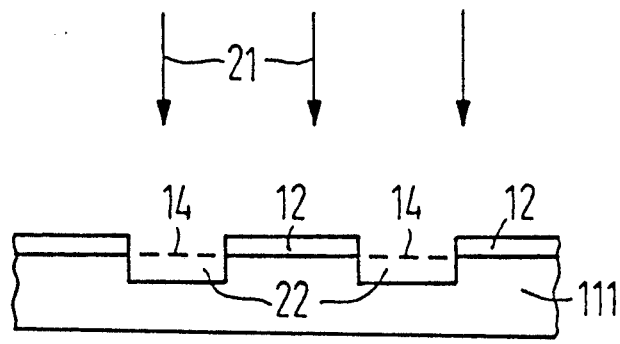

FIG. 4 shows the charging of the green film 11 with a liquid jet 21, namely as seen proceeding from the side provided with the photoresist layer 12.

The erosive action of the liquid jet 21 effects a strip-shaped depression 22 in the surface of the green film 111 that is now structured, as shown in FIG. 4.

Figure 5:
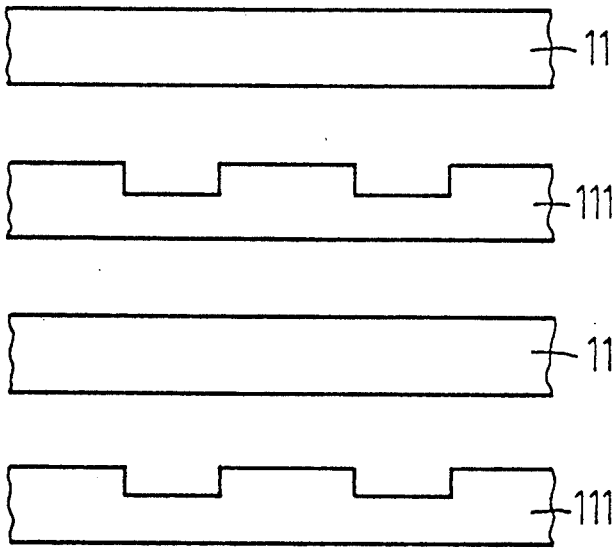
Figure 6:
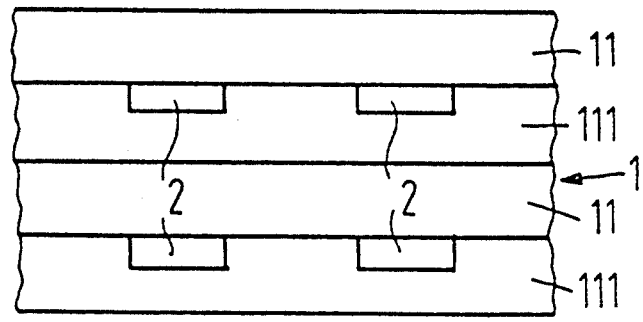

In an extended view, FIG. 5 shows two green films 111 that have been processed in accord with the method of the invention and shows two unmodified green films 11. For example, such films 111, 11, 111, 11 . . . are stacked on top of one another in the way that proceeds from this figure. Such a compressed stack is sintered in a way that is standard per se, so that a monolithic ceramic member 1 having the channels 2 contained therein arises therefrom Although other modifications and changes may be suggested by those skilled in the art, it is the intention of the inventor to embody within the patent warranted hereon all changes and modifications as reasonably and properly come within the scope of his contribution to the art.

I claim:

1. A method for producing a ceramic film or tape having recesses, comprising the steps of:
    using a green film or tape having a binder system contained therein;
    providing a surface of the green film with a photoresist layer in which structures having a prescribed, planar distribution and size of the recesses to be produced are produced in a photolithographic way for employment as a mask;
    producing the recesses down to a respective prescribed depth in the green film by erosion with a liquid jet, the photoresist layer being effective as a mask layer for the respective erosion; and
    using an agent that has a selective solubility for the binder system contained in the green film for the liquid jet.

2. A method according to claim 1, wherein for a binder system based on acrylic acid ester, the agent of the liquid jet is composed essentially of benzene hydrocarbon, and a material that is resistant to benzene hydrocarbon at least for a time span of processing is employed for the photoresist layer.

3. A method for producing sintered members having inwardly disposed cavities, comprising the steps of:
    producing a plurality of green films or tapes with depressions, including the steps of:
    applying a photoresist layer on a surface of a green film,
    photolithographically forming structures in said photoresist layer corresponding to said depressions,
    eroding material of said green film with a liquid jet using said photoresist layer as a mask to form said depressions,
    stacking said green films on top of one another;
    pressing said stacked green film together; and
    sintering said stacked green films.

4. A method according to claim 3, wherein non-structured green films are stacked with said green films having said depressions before being pressed and subsequently sintered.

5. A method according to claim 3, wherein said sintered members are used as ultrasound transducers.

* * * * *